(12) United States Patent
Fischer

(10) Patent No.: US 9,559,621 B2
(45) Date of Patent: Jan. 31, 2017

(54) METHOD AND SYSTEM FOR DETERMINING AN OFFSET BETWEEN A DETECTOR AND A POINT ON A MOTOR

(71) Applicant: Control Techniques Limited, Newtown (GB)

(72) Inventor: Jürgen Fischer, Eitorf (DE)

(73) Assignee: CONTROL TECHNIQUES LIMITED, Newtown (GB)

( * ) Notice: Subject to any disclaimer, the term of this patent is extended or adjusted under 35 U.S.C. 154(b) by 0 days.

(21) Appl. No.: 14/736,439

(22) Filed: Jun. 11, 2015

(65) Prior Publication Data

US 2015/0365027 A1    Dec. 17, 2015

(30) Foreign Application Priority Data

Jun. 12, 2014   (GB) .................................. 1410527.4

(51) Int. Cl.
*H02P 23/12*   (2006.01)
*H02P 6/16*    (2016.01)
*G01R 23/00*   (2006.01)

(52) U.S. Cl.
CPC ................ *H02P 6/16* (2013.01); *G01R 23/00* (2013.01)

(58) Field of Classification Search
CPC .................................. G01R 23/00; H02P 6/16
See application file for complete search history.

(56) References Cited

U.S. PATENT DOCUMENTS

| 5,642,461 | A | 6/1997 | Lewis |
| 5,894,210 | A | 4/1999 | Brown et al. |
| 6,459,230 | B1 | 10/2002 | Tao |
| 6,777,896 | B2 | 8/2004 | Teng |
| 6,826,499 | B2 | 11/2004 | Colosky et al. |
| 7,279,859 | B2 | 10/2007 | Hill |
| 7,508,154 | B1 | 3/2009 | Labriola, II |
| 7,548,039 | B2 | 6/2009 | Oomura et al. |

(Continued)

FOREIGN PATENT DOCUMENTS

| EP | 2584693 | 4/2013 |
| GB | 2497721 | 6/2013 |
| WO | 2013/164527 | 11/2013 |

OTHER PUBLICATIONS

Lovas, BLDC Sensorless Algorithm Tuning, 2012, pp. 2-9.

(Continued)

*Primary Examiner* — Karen Masih
(74) *Attorney, Agent, or Firm* — Harness, Dickey & Pierce, P.L.C.

(57) ABSTRACT

The present disclosure relates to a method of determining an offset between a detector and a point on a motor, the movement of the point on the motor being impeded in at least one direction. In particular, this disclosure relates to a method of determining a commutation offset for an encoder that works in conjunction with a synchronous motor. The commutation offset is an offset between the detector and the north pole of a permanent magnet within the motor. The method comprises setting a test value for the offset, causing a displacement of the detector based on the test value and measuring that displacement. The method further comprises repeatedly increasing the test value, and causing and measuring a displacement for each so increased test value until it is determined that the test value has crossed a threshold.

14 Claims, 11 Drawing Sheets

(56) References Cited

U.S. PATENT DOCUMENTS

| | | |
|---|---|---|
| 7,564,206 B2 | 7/2009 | Oomura |
| 7,579,702 B2 | 8/2009 | Park et al. |
| 7,960,938 B2 | 6/2011 | DeLange |
| 8,106,618 B2 | 1/2012 | Fabis et al. |
| 2008/0042610 A1 | 2/2008 | Welk et al. |
| 2008/0216782 A1* | 9/2008 | Stork .................... F01L 1/352 |
| | | 123/90.17 |
| 2011/0001444 A1 | 1/2011 | Krause et al. |

OTHER PUBLICATIONS

Shao, Direct Back EMF Detection Method for Sensorless Brushless DC (BLDC) Motor Drives, 2003, pp. 1-83.
iDrive Start Up Guide for Rotary Servo Motors, Aug. 27, 2003, pp. 1-13.
Universal Variable Speed AC Drive for Induction and Servo Motors, 2003, pp. 1-208.
RSS-NIR Phase Initialization for the PMD Ion 500 Motor Drive and Brushless Servo Motor with Encoder Feedback, Jul. 1, 2011, 3 pages.
Encoder of Resolver Offset Test (Autotuning) for Glass Systems with HMIs, pp. 1-6.

* cited by examiner

METHOD AND SYSTEM FOR DETERMINING AN OFFSET BETWEEN A DETECTOR AND A POINT ON A MOTOR

CROSS-REFERENCE TO RELATED APPLICATION

This application claims the benefit and priority of Great Britain Patent Application No. 1410527.4 filed Jun. 12, 2014. The entire disclosure of the above application is incorporated herein by reference.

FIELD

This disclosure relates to a method of, and system for, determining an offset between a detector and a point on a motor. In particular, but without limitation, this disclosure relates to a method of determining a commutation offset for an encoder that works in conjunction with a rotary or linear motor.

BACKGROUND

This section provides background information related to the present disclosure which is not necessarily prior art.

Motors are used to power the operation of a wide range of devices from very small scale machines to much larger assemblies such as elevators (also known as "lifts"). One of the most common forms of motor used, particularly in industrial applications requiring a constant motor speed, are synchronous motors. Synchronous motors synchronise the rotation of a shaft of a motor with a frequency of an Alternating Current (AC) electrical supply used to power the motor.

In general terms, a synchronous motor comprises a stator and a rotor. The stator includes a number of coils or windings through which electric currents can be fed. The rotor comprises at least one pair of magnets which may be electromagnets or permanent magnets. When an AC current is fed through a winding of the stator, the winding generates a changing magnetic field. Therefore, in a three-phase motor, when the three-phase components of a three-phase AC current are fed through three respective windings, a rotating magnetic field is created in the stator. The rotating magnetic field created in the stator causes rotation of the rotor and, when the load driven by the motor is low, the speed of rotation of the rotor is synchronous with the frequency of the three-phase AC current. The angle between the rotor and the stator produces a resultant net torque, which dictates the net rotational movement of the rotor.

In order for the net rotational movement of the rotor to be in a desired direction and at a desired speed at any given time, the net torque of the rotor must be controlled. The position and phase at which current is injected into the windings of the stator relative to the magnets of the rotor will determine the configuration of the magnetic flux produced by the stator. This will affect the rotational movement imparted by the winding on the rotor, which in turn determines the net torque exerted upon the rotor.

In order to determine and control the torque produced by a motor, the relative position between the stator and the rotor should be determined. Only current that has a component perpendicular to the rotor's magnetic flux will cause torque to be exerted upon the rotor. For a stator which has three windings, the current vector resulting from the three currents in combination should be perpendicular to the rotor's magnetic flux in order to maximise torque; if instead the current vector and the magnetic flux are parallel, then no torque will be produced. Therefore, maximum torque can be achieved for a synchronous motor by controlling the phase and timing of currents supplied to the stator.

A detector such as a rotary (or shaft) encoder may be used to provide information on the position of a rotor relative to a stator. A rotary encoder encodes information about the relative angular position or motion of a shaft in an analogue or digital manner. One type of rotary encoder is an incremental rotary encoder, which provides an output only when the encoder is rotated. Another type is an absolute encoder, which produces a unique code for each distinct angular position of the shaft.

Rotary encoders can comprise a rotatable disc having a plurality of apertures and being mounted on the shaft of the rotor and one or more light emitting devices (LEDs) and photodetectors coupled to the stator. Light emitted from the LED(s) is received by a given photodetector only when a corresponding aperture in the disc is aligned with that photodetector. Accordingly, rotation of the shaft will cause the photodetectors to receive a series of signals from which the relative positioning between a point on the rotor and a point on the stator can be determined.

An encoder can comprise memory on, for example, an electronic chip and a processor and/or it can provide feedback to another device that comprises a processing means. In a drive system, the controller or "drive unit" includes a processor which can receive and process information from the encoder. Primarily, an encoder operates as a feedback device to enable the drive unit to use the relative rotor and stator positions to determine the timing, phase and angle of current to be supplied to the stator windings. Encoders are not always mounted on rotor shafts in a predetermined manner and so there may be a 'commutation offset' angle between the actual zero position of a given encoder on a shaft and the zero position of the rotor with respect to the stator. For example, the commutation offset may be measured as the angle between the zero position of the encoder and the north pole of a magnet on the rotor.

Aspects and features of the present disclosure are set out in the appended claims.

SUMMARY

This section provides a general summary of the disclosure, and is not a comprehensive disclosure of its full scope or all of its features.

An effect of the present disclosure is the provision of an approach for determining the commutation offset angle between a rotary encoder and a point on a motor thereby enabling more optimal torque control.

Another effect of the present disclosure is that, during drive assembly, time and effort do not need to be expended in order to rotationally align a rotary encoder to a rotor upon which it is to be mounted.

The present disclosure enables calibration of a rotary encoder that has been moved on, or fitted to, an already loaded drive system, for example one that includes a lift, without the need to remove the load and/or disassemble the drive system—which could be very difficult and/or time consuming.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Throughout the description and the drawings, like reference numerals refer to like parts.

DETAILED DESCRIPTION

Example embodiments will now be described more fully with reference to the accompanying drawings.

Figure 1:
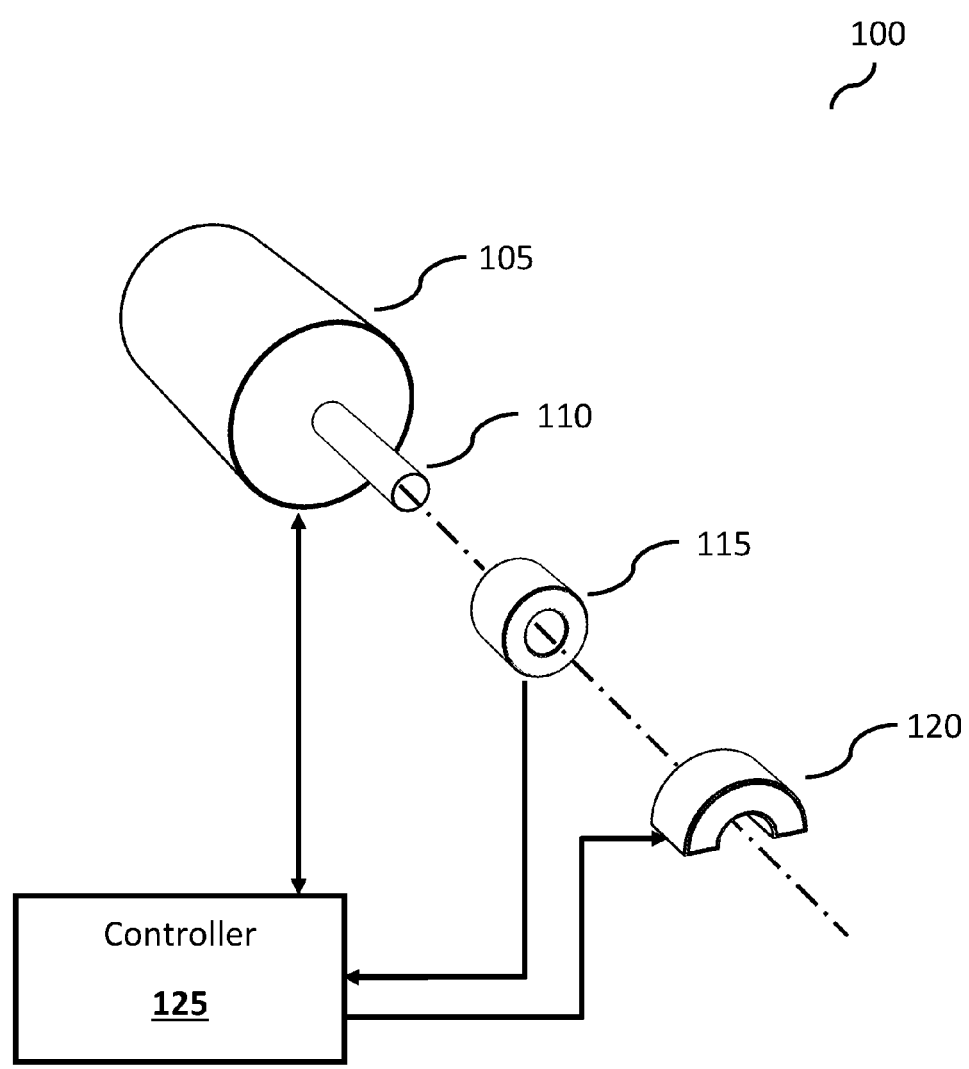
FIG. 1 shows a diagram of a drive system.

FIG. 1 illustrates a drive system 100 comprising a motor 105 having a rotor (not shown) coupled to a motor shaft 110. A rotary encoder 115 is mounted on the shaft 110, such that a portion of the rotary encoder 115 rotates with the rotor of the motor 105. A brake 120 may be applied to the shaft 110 in order to impede the rotation of the shaft 110. The brake may be arranged to impede rotation of the shaft 110 (and therefore also the rotor) in both clockwise and anticlockwise directions or in only one of those directions. The motor 105, rotary encoder 115, and/or brake 120 are coupled to a controller 125, which is arranged to control the operation of the motor 105 and/or brake 120 and process signals received from the rotary encoder 115.

Figure 2:
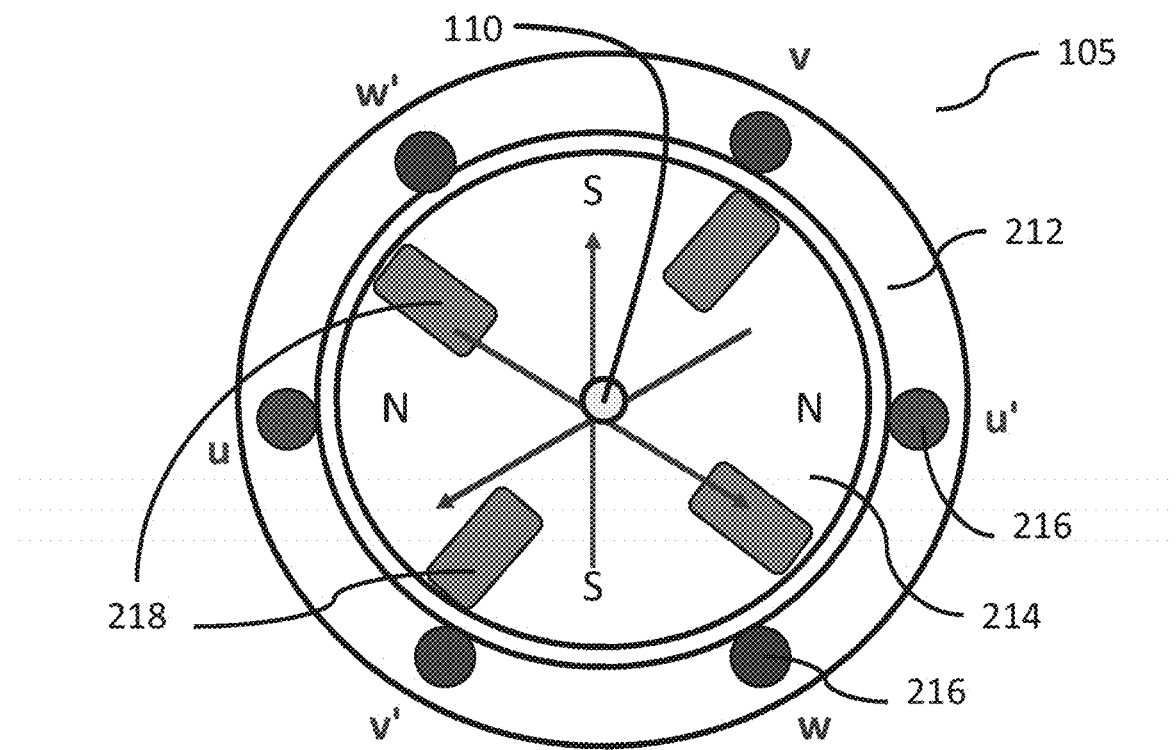
FIG. 2 shows a cross-sectional representation of an exemplative synchronous motor.

FIG. 2 shows a cross-sectional representation of an exemplative motor 105. The motor 105 comprises a stator 212 and a rotor 214. The stator 212 and rotor 214 are circular in shape and concentric with one another, the rotor 214 being arranged within the stator 212. The stator 212 includes a number of coils or windings 216 through which electric currents can be fed. The rotor 214 comprises at least one pair of permanent magnets 218.

As mentioned above, the commutation offset of a motor 105 comprises the angular shift or offset of the zero position of the encoder 115 as compared to the north pole of a magnet of the rotor 214. The zero position of the encoder 115 may be physically shown as a zero marking on the encoder body or it may be a virtual reference point.

In order to provide accurate feedback for correct current control within the motor 105, it is preferable either that the zero position for the encoder 115 is physically aligned with the north pole of a magnet 218 of the rotor 214, or that the offset between that zero position and the north pole is known so that it can be accounted for. In practice it is difficult and time consuming to align the zero position of an encoder 115 with the north pole of the rotor 214.

Figure 3:
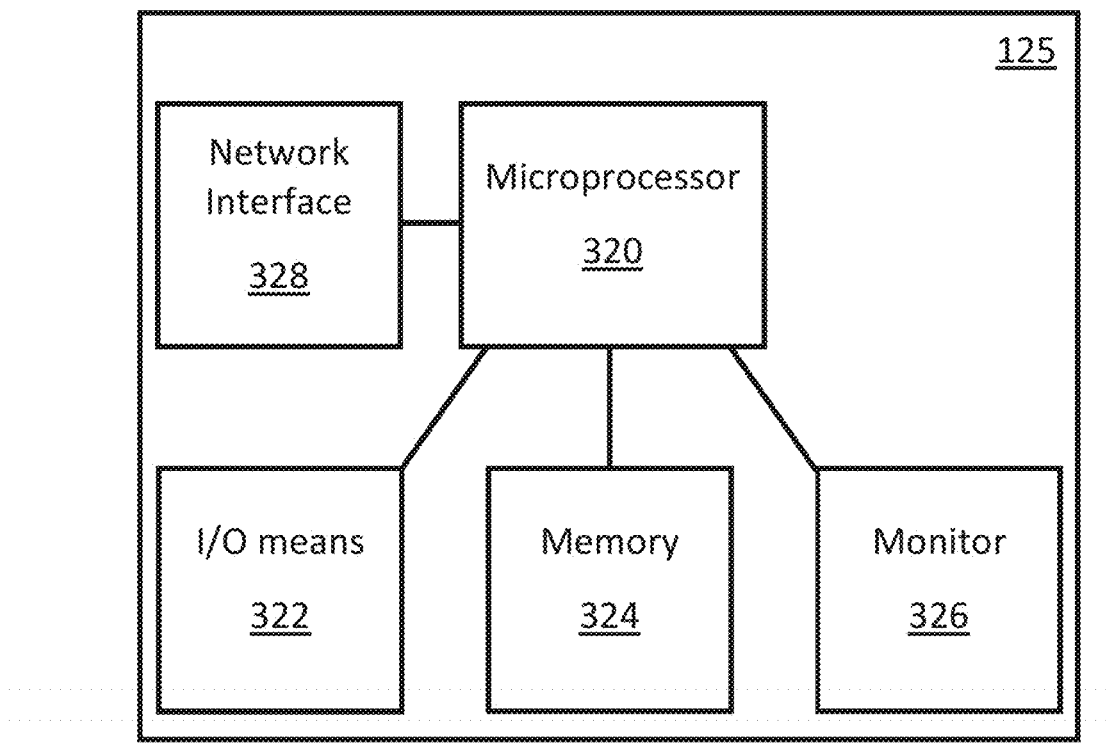
FIG. 3 shows a block diagram of an apparatus for implementing elements of the approach described herein.

FIG. 3 shows a block diagram of an apparatus for implementing elements of the approach described herein. A controller 125 comprises a microprocessor 320 arranged to execute computer-readable instructions as may be provided to the controller 125 via input/output means 322 which may be arranged, without limitation, to interface with: floppy disks, compact discs, USB sticks, one or more keyboards, and/or one or more computer mice. The microprocessor 320 may also store instructions in a memory 324, for example a random access memory. The microprocessor 320 is arranged to output results of executed programmes at the input/output means 322, via a monitor 326, and/or may communicate those results to another device via a network interface 328 that is arranged to couple the controller 125 to a communications network such as the internet (not shown in FIG. 3). The microprocessor 320 may be further arranged to receive instructions and/or data via the network interface 328.

Figure 4:
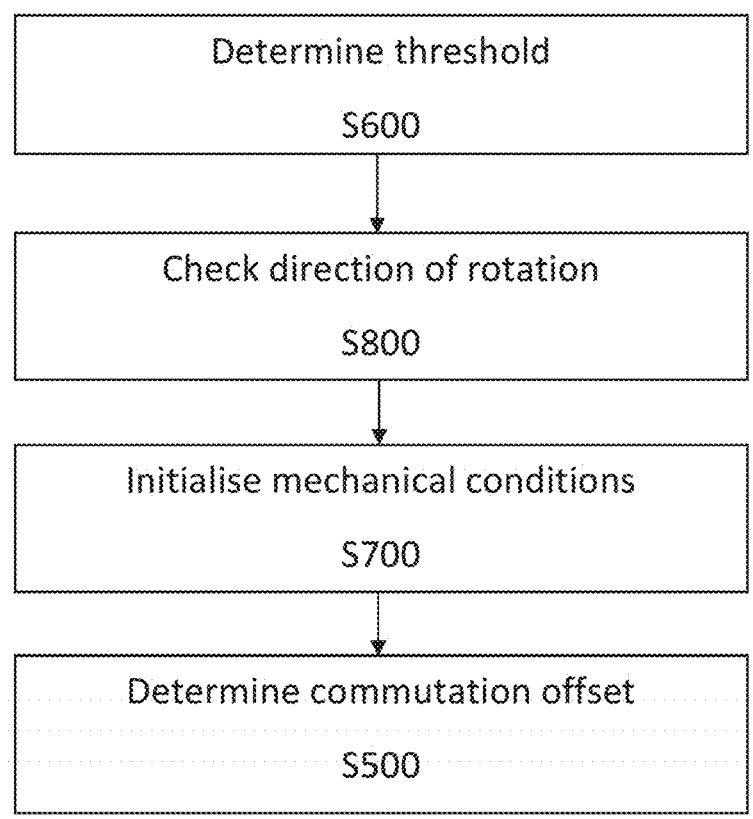
FIG. 4 shows a flow chart of an approach described herein.

A method for determining the commutation offset of a motor 105 is explained with respect to FIG. 4 which shows steps of a method that can be performed in order to determine the commutation offset. One of the effects of the approach described herein is that the offset can be determined without removing any load from the motor, which removing can, in practice, be very difficult and/or time-consuming, particular for lifts, cranes, hoists, test rigs, and servo presses.

At step S600 a threshold for the displacement of the encoder 115 is determined. The details of step S600 are described below with reference to FIG. 6.

At step S800 a determination is made as to the direction in which the rotor's rotation is impeded. The details of step S800 are described below with reference to FIG. 8.

At step S700, an initialisation is performed to allow initial mechanical conditions to settle. The details of step S700 are described below with reference to FIG. 7.

At step S500, a determination of the commutation offset is made. The details of step S500 are described below with reference to FIG. 5.

As will become apparent to a person skilled in the art, one or more of steps S600, S700, and S800 may be omitted from the approaches described.

Figure 5:
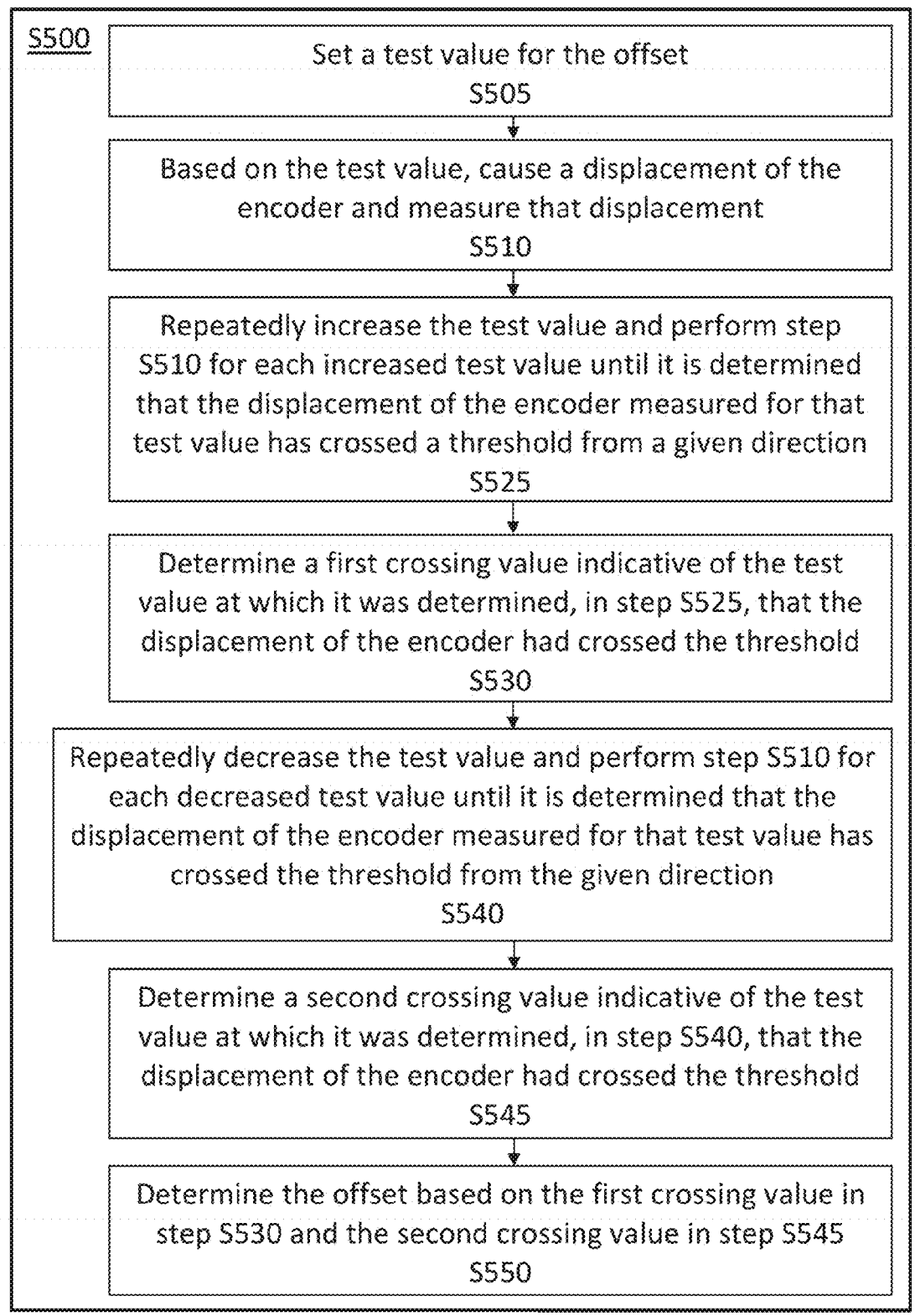
FIG. 5 shows a flow chart illustrating the steps of a method of determining an offset.

FIG. 5 shows the steps of S500, which are performed to determine the commutation offset for a motor the rotor of which is impeded from rotating in at least one direction.

As a first step S505, a test value for the offset is set. The test value represents an assumed value for the offset, and is not necessarily correct. The initial test value is arbitrary, although for convenience a value of 0 degrees may be chosen.

In a subsequent step S510, based on this initial test value, the controller 125 determines the characteristics, such as phase and timing, of the current(s) that should be applied to the stator winding(s) 216 in order to achieve maximum torque on the motor 105, assuming the initial test value is correct and so represents the commutation offset. The controller 125 then applies the one or more currents with a given magnitude to the stator winding(s) 216. When the test value is correct, the current(s) applied will achieve maximum torque; however, in reality, as the initial test value is unlikely to be correct, the current(s) applied may not achieve maximum torque.

As a result of applying the current(s), a torque is applied to the rotor 214. As the rotor 214 of the motor 105 is impeded from rotating (for example by the brake 120 and/or by a load—not shown), the rotor 214 remains substantially stationary. However, as the rotation of the rotor is impeded by a brake 120 attached to the shaft 110 or by a load, although the portion of the shaft that is impeded may not move at all, rotational flex in the shaft means that a torque applied to the rotor results in a small (micro) rotational movement of the portion of the shaft upon which the encoder 115 is mounted. Accordingly, the rotational movement that is caused when the current is applied for the initial test value is measured by the encoder 115, and transmitted to the controller 125.

In step S525, the controller 125 repeatedly increases the test value and performs step S510 for each so increased test value, until the controller 125 determines that the displacement of the encoder 115 measured for that test value has crossed a threshold from a given direction. This threshold may either be fixed, or may be determined prior to performing the steps of S500; for example, it may be determined by performing the steps of S600. The point at which the displacement crosses the threshold corresponds to an approximation of the point at which the torque applied to the rotor is zero. The given direction may be either from above or from below the threshold, but the given direction should be the same throughout S500. Each time the test value is changed, measurement of the corresponding displacement of the encoder 115 may optionally be delayed for a predetermined time interval to allow for settling.

Because the offset for a rotary motor is an angular quantity, the test value is defined modulo 360 degrees, or equivalently modulo $2\pi$ radians (or indeed using any other measurement of angular position—which could then be treated in a modulo manner). Accordingly, a test value of 450 degrees is equivalent to a test value of 90 degrees, for example. In the following, for convenience it will be assumed that all test values are in the range 0 to 360 degrees.

In step S510, each increased test value results in a current with different characteristics being applied. Because the magnitude of the current is fixed, the change to the current characteristics (for example, phase and timing) will result in a rotation of the current vector and consequently a change in the angle between magnetic flux and current in the motor 105. As a result, the torque will change—thereby causing a different displacement of the encoder 115 with respect to its initial position.

In step S530, the controller 125 determines a first crossing value indicative of the test value at which it was determined, in step S525, that the displacement of the encoder 115 had crossed the threshold. The first crossing value may, for example, be the last test value before the threshold was crossed, or be the first test value after the threshold was crossed, or be based on a combination of the first and last test values (for example, an average (a mean) of the first and last test values).

In step S540, the controller 125 repeatedly decreases the test value and performs step S510 for each so decreased test value, until the controller 125 determines that the displacement of the encoder 115 measured for that test value has again crossed the threshold from the given direction.

In step S545, the controller 125 then determines a second crossing value indicative of the test value at which it was determined, in step S540, that the displacement of the encoder 115 had crossed the threshold.

Instead of performing steps S525 and S530 followed by steps S540 and S545, steps S540 and S545 can instead be performed prior to steps S525 and S530, that is, the test value can first be repeatedly decreased and then repeatedly increased.

In step S550, the controller 125 determines the offset based on the first crossing value of step S530 and the second crossing value of step S545. For example, the offset may be determined as the mean of the first and second crossing values, or as a weighted average of the first and second crossing values. Under ideal conditions, the first crossing value would be equal to the second crossing value; however, due to mechanical friction and the load driven by the motor, these two values are not equal. By determining the offset based on both of these values, the accuracy of the determined offset is improved.

In the approach of FIG. 5, the threshold is crossed twice from the same (mechanical) direction and under almost the same mechanical conditions (mechanical load, movement start point, mechanical friction), but from two different electrical directions.

As one possibility, the first crossing value could instead be chosen as the test value for which the displacement crossed the threshold from above, and the second crossing value could be chosen as the test value for which the displacement subsequently crossed the threshold from below (or vice versa). However, such an approach would not yield an accurate offset in situations where the mechanical conditions differ depending on the direction in which the rotor 214 rotates; for example, in situations where there is a load in only one direction.

Once a value for the offset has been determined at step S550, it can be used to calibrate the motor 105 and encoder 115 assembly. For example, following step S550, when the encoder 115 provides information about the relative position of shaft 110 and the stator 212, the controller 125 can adjust the received position information to compensate for the commutation offset before it determines the current to be fed into the stator windings 216 when driving the motor 105.

When the rotation of the rotor 214 is impeded in both directions and there is no lash (also known as backlash) between the rotor 214 and the element that is impeding its motion (for example the brake 120 or a gearbox—not shown), the displacement of the rotor 214 will primarily be due to mechanical torsion of the shaft 110, and will only be very small (for example, around 0.004 degrees). Example encoders that could be used include the SC.Endat, SC.Hiper, and SC.SSI encoders from Control Techniques Ltd.

In general terms, the encoder 115 used should be sensitive enough to detect very small displacements of the shaft 110 or rotor 214. For example the encoder 115 can be arranged to measure the displacement in increments of $\frac{1}{65536}$ of a complete turn (or rotation) of the rotor 214, or less. If the encoder 115 is arranged to measure the displacements as a result of the incremental changes to the test value for the offset in unit-less steps or increments, and if a particular change in commutation offset results in a displacement of less than one step or increment, the test can be repeated using increased constant torque (achieved by changing the magnitude of the current at step S510). The encoder 115 may be able to record the measurement values, or it may just feed them back to a microprocessor, for example a processor within a drive unit or controller 125. The drive unit can be programmed to abort the method S500 if certain conditions are not met. For example, if the displacement measured by the encoder 115 at any time exceeds a predetermined value, such as 1/16 of a complete rotation, the drive unit can determine that the motor 105 is not sufficiently impeded and so can abort the method in order for the motor 105 to be better impeded. The method described herein does not require any additional measurement or processing equipment to be incorporated into a motor or drive system in order to calibrate it. In particular, conventional drive systems include processors which can be programmed to perform the steps of the method described herein.

Figure 6:
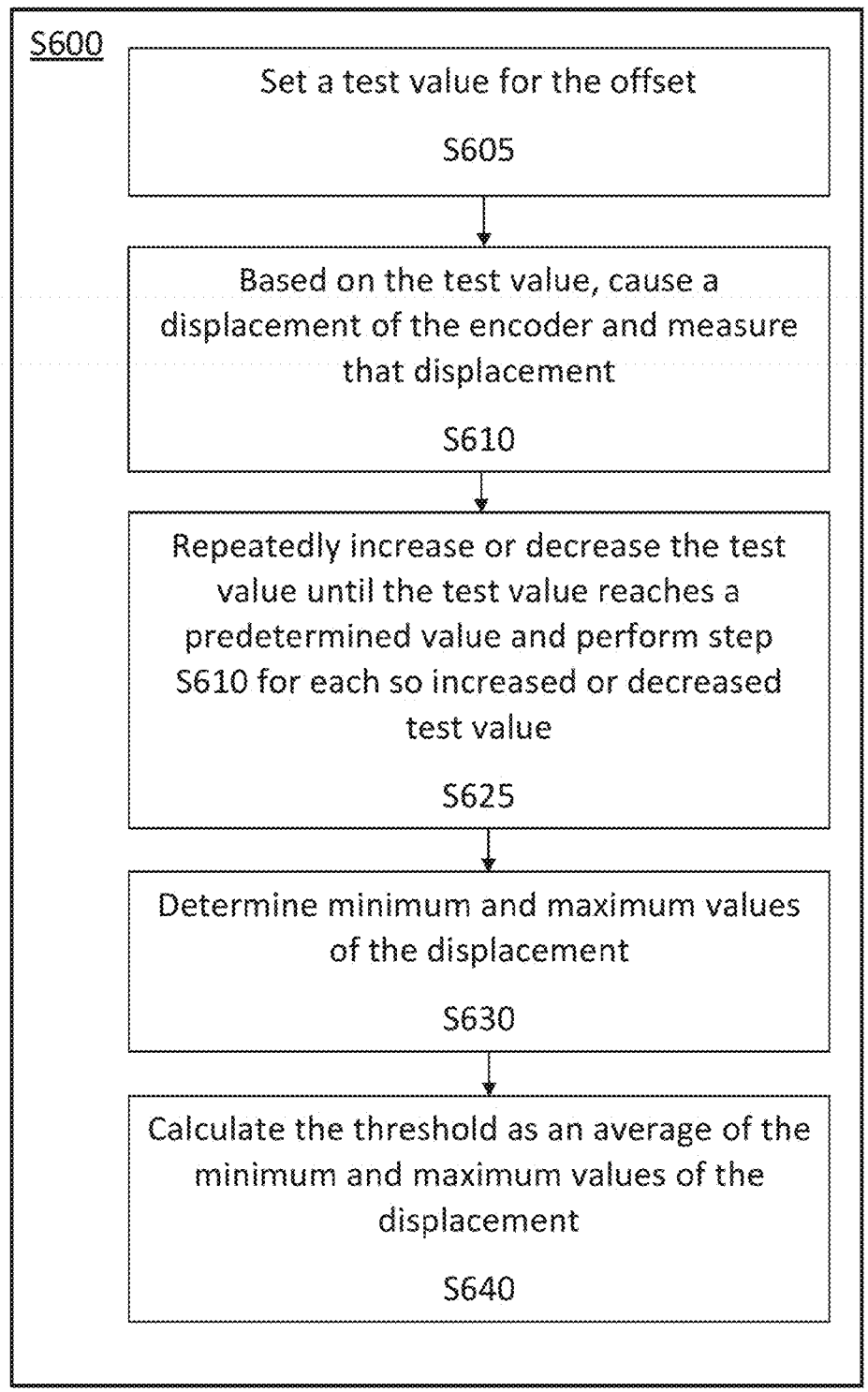
FIG. 6 shows a flow chart illustrating the steps of a method of determining a threshold for a displacement of the encoder.

FIG. 6 shows the steps of S600, which may be performed in order to determine the threshold that is employed in steps S525 and S540. As one possibility, this threshold could instead be predetermined: in such cases the threshold would be selected to be sufficiently high to detect a measured displacement that represents an actual displacement of the encoder 115 (and not a measured displacement that instead represents measurement noise), and sufficiently low to ensure that, by the time that the measured displacement is equal to the threshold value, the speed of rotation of the shaft 110 is less than a predetermined speed.

At step S605, a test value for the offset is set. In a subsequent step S610, based on the initial test value, the controller 125 determines the characteristics, such as phase and timing, of the current(s) that should be applied to the stator winding(s) 216 in order to achieve maximum torque on the motor 105 for a given current magnitude. The controller 125 then applies the current(s) to the stator winding(s) 216, thereby causing a displacement of the encoder 115. The displacement is measured by the encoder 115, and transmitted to the controller 125.

In step S625, the controller 125 then repeatedly increases the test value and performs step S610 for each so increased test value until the test value reaches a predetermined value. For example, if the initial test value is 0 degrees, the predetermined value may be 360 degrees, such that a full range of values is tested. In step S625, the test value can alternatively be repeatedly decreased, and step S610 repeated for each so decreased test value. Minimum and maximum values of the measured displacements are then determined in step S630.

In step S640, the threshold is calculated as an average of the minimum and maximum values of the displacement, determined in step S630. For example, the threshold may be calculated as the mean of the minimum and maximum values of the displacement, or as a weighted average of the minimum and maximum values of the displacement.

Figure 7:
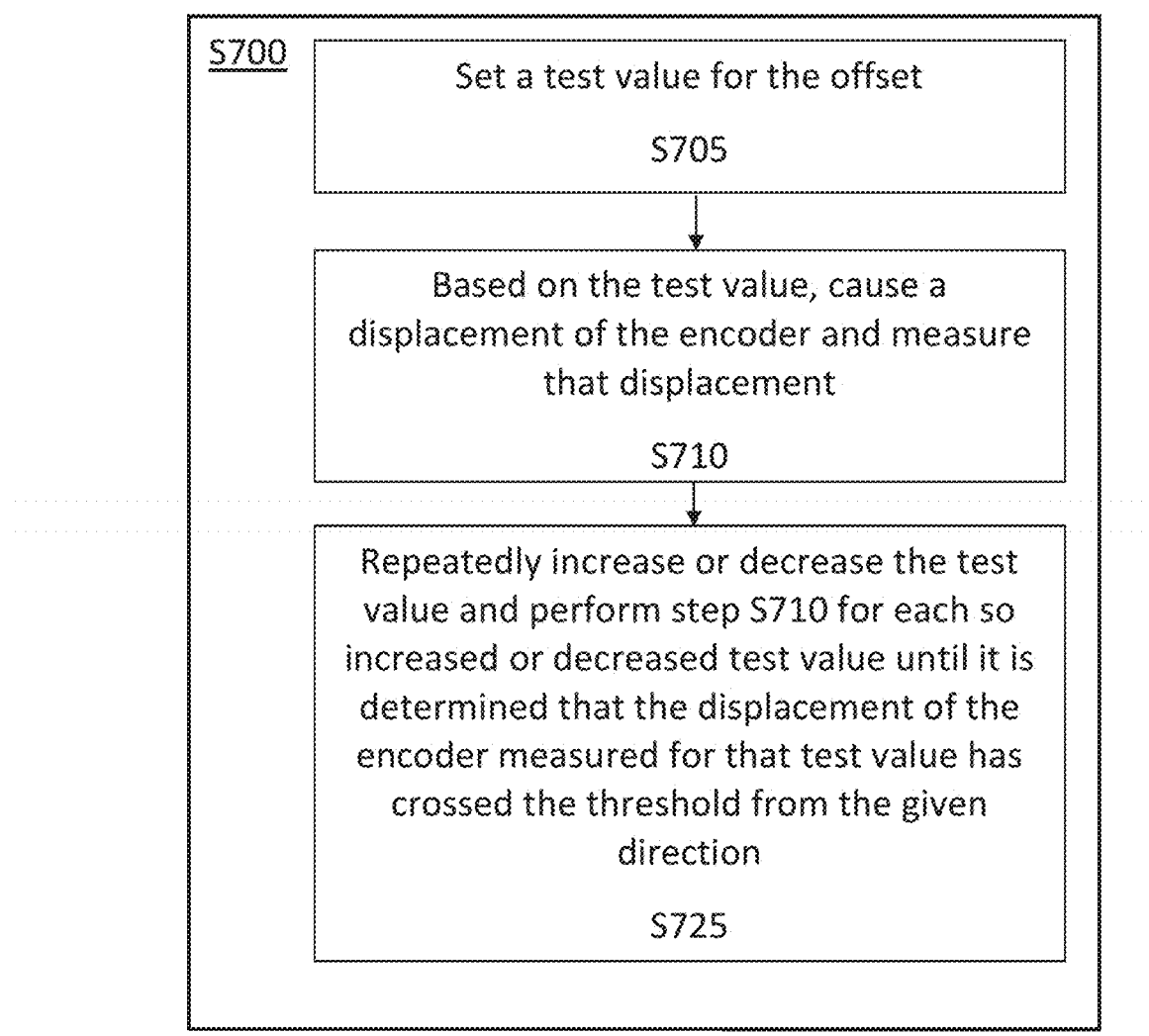
FIG. 7 shows a flow chart illustrating the steps of a method of initialising mechanical conditions of a motor.

FIG. 7 shows the steps of S700, which may be performed in order to initialise mechanical conditions of the motor 105. The purpose of this initialisation is to ensure that that the determination of the offset in S500 is always begun under the same mechanical conditions, thereby increasing the accuracy of the determined offset and ensuring that the results obtained are repeatable. In particular, if the rotor of the motor is positioned so as to be in, or very close to, the first crossing point immediately prior to S500 occurring and the method starts at S500, then the fact that the method has only just started when the first crossing point is reached may mean that initial mechanical conditions will not have had sufficient time to settle by that time—thereby reducing accuracy.

At step S705, a test value for the offset is set. In a subsequent step S710, based on this initial test value, the controller 125 determines the characteristics, such as phase and timing, of the current(s) that should be applied to the stator winding(s) 216 in order to achieve maximum torque on the motor 105 for a given current magnitude. The controller 125 then applies the current(s) to the stator winding(s) 216, thereby causing a displacement of the encoder 115. The displacement is measured by the encoder 115, and transmitted to the controller 125.

In step S725, the controller 125 repeatedly increases the test value and performs step S710 for each so increased test value until the controller 125 determines that the displacement of the encoder 115 measured for that test value has crossed the threshold from the given direction. In step S725, the test value can alternatively be repeatedly decreased, and step S710 repeated for each so decreased test value.

Figure 8:
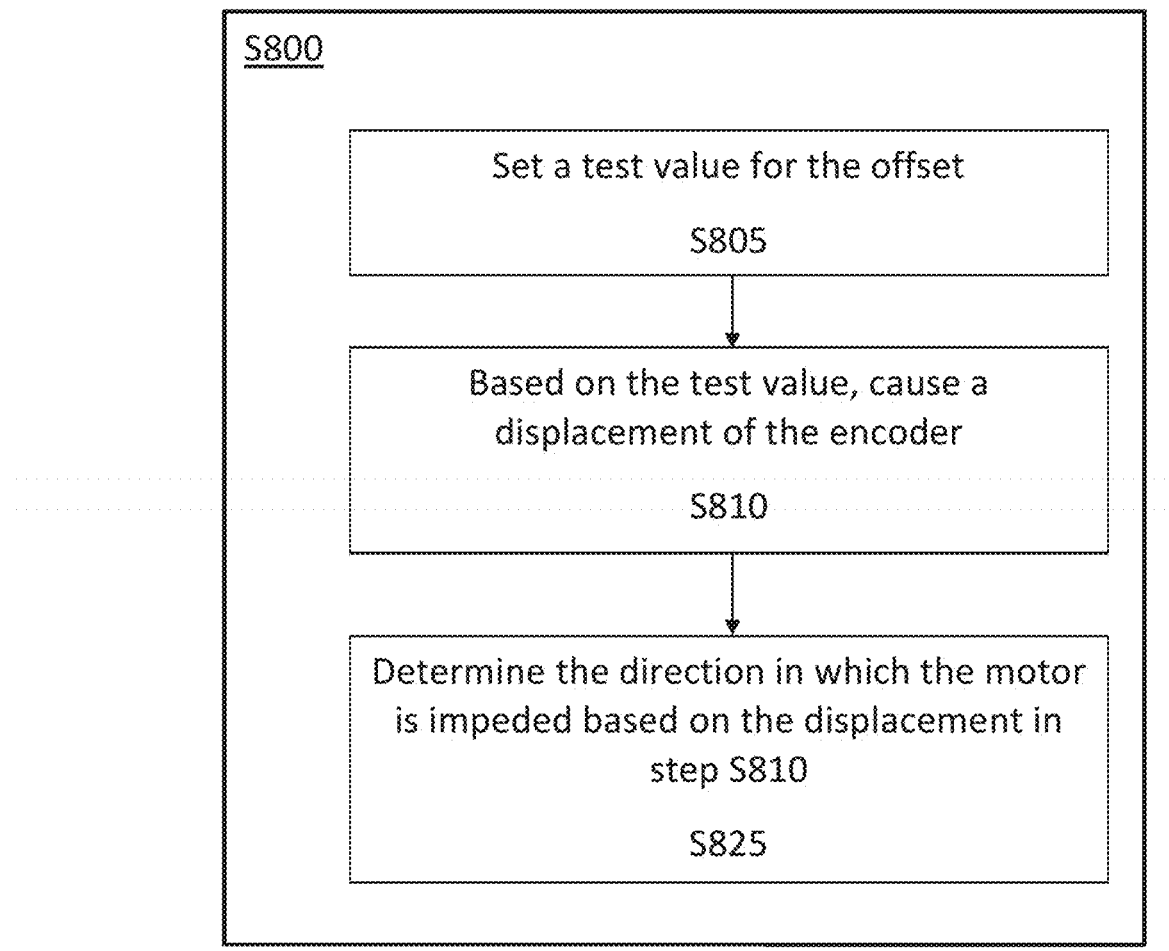
FIG. 8 shows a flow chart illustrating the steps of a method of determining the direction in which a rotor's rotation is impeded.

FIG. 8 shows the steps of S800, which may be performed in order to determine the direction in which rotation of the rotor is impeded, in the case where the rotor's rotation is impeded in a single direction. This determination enables the initialisation steps S700 and offset determination steps S500 to be performed with the rotor 214 rotating in the direction in which it is impeded, rather than in the other direction, as that would result in the rotor starting to spin.

At step S805, a test value for the offset is set. In a subsequent step S810, based on this initial test value, the controller 125 determines the characteristics, such as phase and timing, of the current(s) that should be applied to the stator winding(s) 216 in order to achieve maximum torque on the motor 105 for a given current magnitude. The controller 125 then applies the current(s) to the stator winding(s) 216, thereby causing a displacement of the encoder 115. The displacement is measured by the encoder 115, and transmitted to the controller 125.

At step S825, the controller 125 determines the direction in which the rotor 214 is impeded based on the displacement measured by the encoder 115. This determination can, for example, be made by checking whether the displacement exceeds a predetermined threshold to indicate that the rotor 214 is not rotating in the direction in which it is impeded.

Once the determination of step S825 has been made, the initial test values of steps S505 and S705 can be chosen such that the displacement caused in steps S510 and S710 is in the determined direction in which the rotation of the rotor 214 is impeded. For example, if the test value of step S805 yielded a displacement in the direction in which the rotor 214 was impeded, this test value could also be used as the initial test value of steps S505 and S705. If the test value of step S805 yielded a displacement in the opposite direction, 180 degrees could be added to the initial test value of steps S505 and S705 to obtain the test value of step S705.

Figure 9:
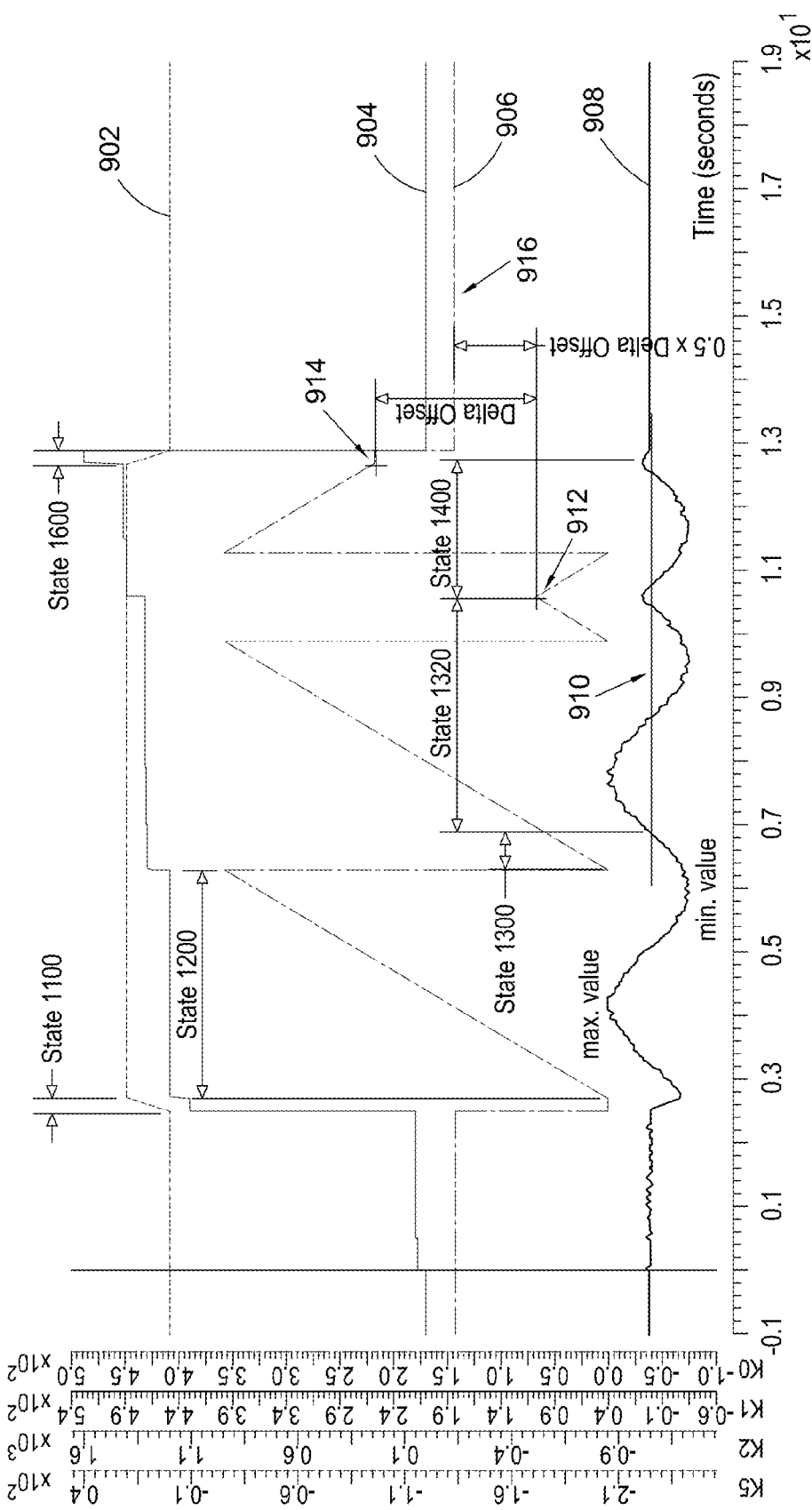
FIG. 9 illustrates a first application of an approach described herein.
Figure 10:
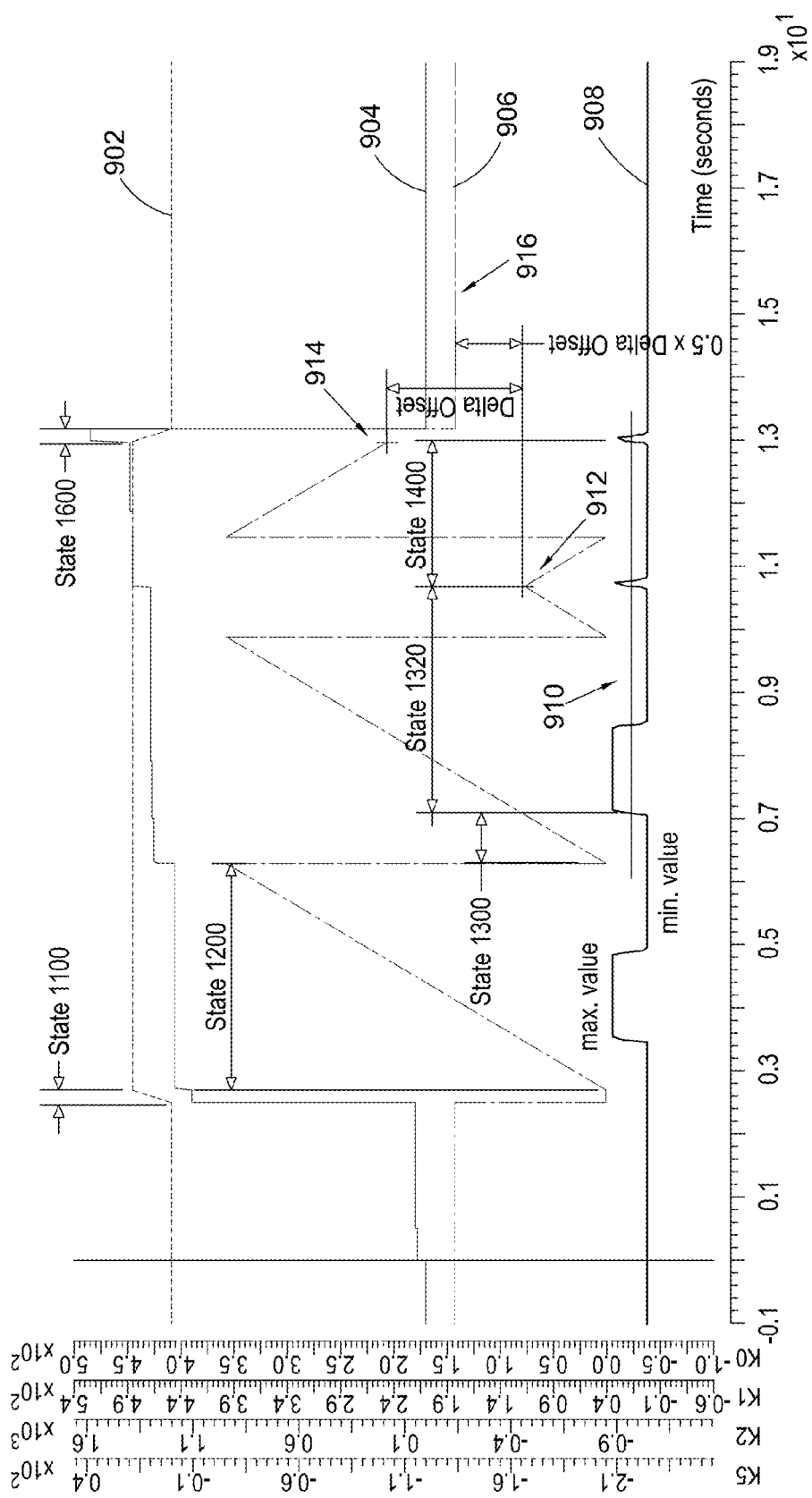
FIG. 10 illustrates a second application of an approach described herein.
Figure 11:
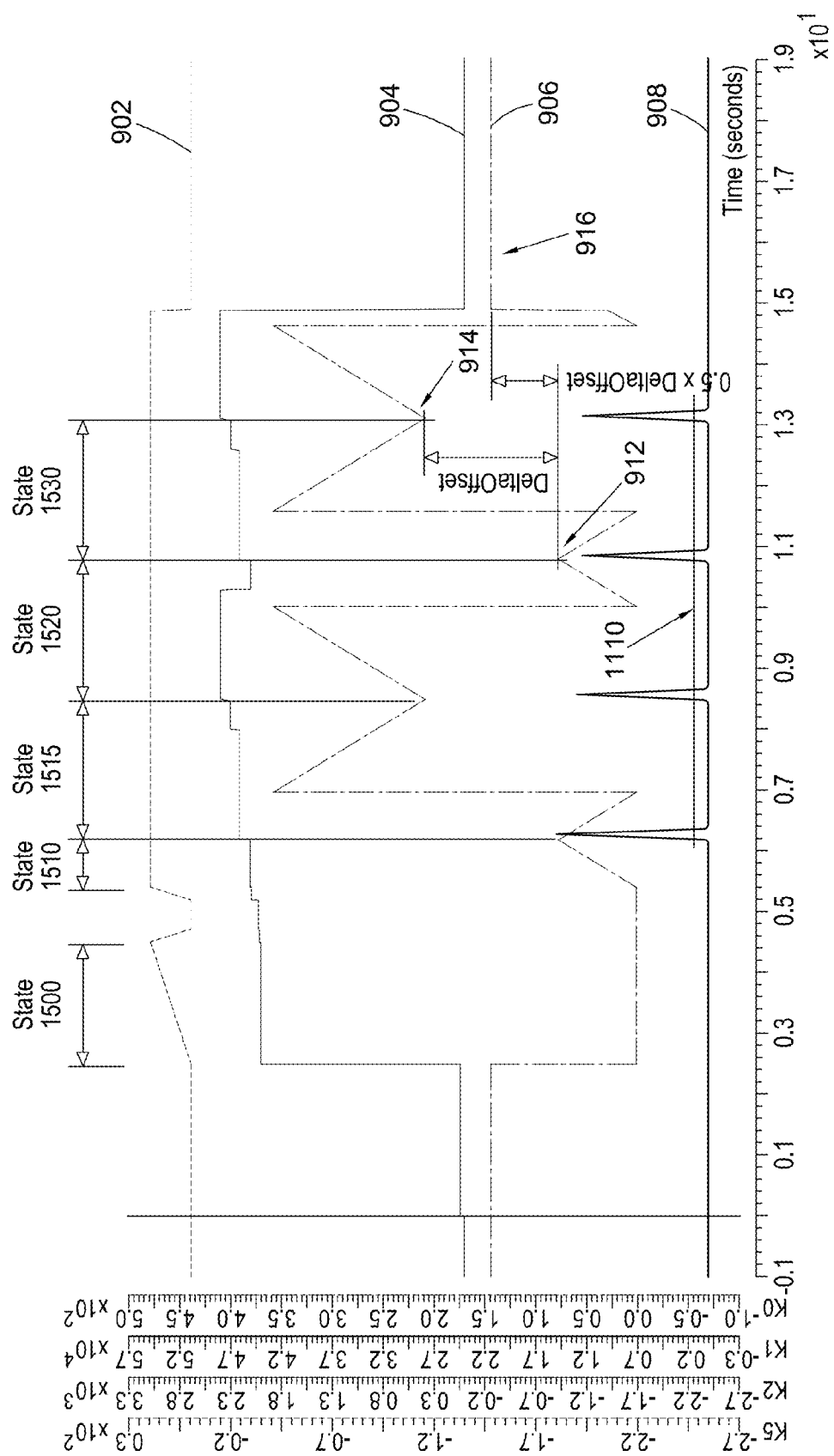
FIG. 11 illustrates a third application of an approach described herein.

FIGS. 9-11 plot as a function of time for three respective different circumstances the sum 902 of the current(s) applied to the winding(s) 216, the state 904 of a programme being executed by the microprocessor, the test value for the offset 906, and the displacement 908 measured by the encoder 115. The corresponding ordinate scales are respectively labelled as K5, K2, K0 and K1 on the left-hand side of FIGS. 9-11.

Circumstance 1: Offset Determination with No Lash and Rotor is Impeded in Two Opposite Directions FIG. 9 illustrates the application of the commutation offset determination approach to a scenario where the rotation of the rotor 214 is impeded in two opposite directions and there is no lash between the rotor and the element that is impeding its motion.

In a first state 1100, the test value 906 is set to an arbitrary initial value. The sum 902 of the current(s) applied to the winding(s) 216 is progressively ramped up to a predetermined level and the encoder 115 begins to move. The current(s) applied to the winding(s) 216 are progressively ramped up in order to ensure that the rotor 214 does not suddenly move in the case where the initial test value for the offset is equal to, or almost equal to, the (correct) offset.

In state 1200, the test value 906 is repeatedly increased (in this example in 0.1 degree steps every 1 ms), and the displacement 908 varies with a near-sinusoidal pattern. This is a consequence of the Lorentz law, which dictates that torque is the cross product of magnetic flux and current. Changing the test value for the offset 906 changes the calculation of the current characteristics that should maximise torque (if that test value was correct), and so when that current is applied, the angle between the applied current and magnetic flux in the motor 105 changes. The torque should vary sinusoidally with that angle, for a fixed magnitude of current, therefore so should the displacement of the encoder 115. In practice, the displacement does not vary purely sinusoidally with the test value due to real-world effects, such as the load on the motor 105 and/or the existence of lash.

By the end of state 1200, a full range of values for the offset has been tested. The minimum and maximum values of the displacement 908 can therefore be determined, and the threshold 910 can be determined according to the steps of S600.

In state 1300, the test value 906 is again repeatedly increased, and at the end of state 1300, the displacement 908 crosses (from below) the threshold 910 determined in state 1200. By the end of state 1300, the mechanical conditions of the motor 105 have therefore been initialised according to S700.

In state 1320, the test value 906 is repeatedly increased until, at the end of state 1320, the displacement 908 once again crosses the threshold 910 (from below) determined in state 1200. Consequently, the threshold crossing at the end of state 1320 corresponds to the end of step S525, and the test value 912 at the end of state 1320 is the first crossing value of step S530.

In state 1400, the test value 906 is repeatedly decreased until, at the end of state 1400, the displacement 908 once more crosses (from below) the threshold 910 determined in state 1200. The threshold crossing at the end of state 1400 corresponds to the end of step S540, and the test value 914 at the end of state 1400 is the second crossing value of step S545.

Once the first crossing value 912 and second crossing value 914 have been determined, the offset 916 is calculated as the mean of the first and second crossing values.

Finally in state 1600, the sum 902 of the current(s) applied to the winding(s) 216 is progressively ramped down to zero.

Circumstance 2: Offset Determination with Lash and Rotor Impeded in Two Opposite Directions FIG. 10 illustrates the application of the commutation offset determination approach to a scenario where the rotation of the rotor 214 is impeded in two opposite directions and there is lash between the rotor and the element that is impeding its motion.

The steps that are performed in circumstance 2 (illustrated in FIG. 10) are the same as those performed in circumstance 1 (illustrated in FIG. 9), therefore, for the avoidance of repetition, a description of these steps has been omitted.

The plots of FIG. 10 are analogous to those of FIG. 9, the main exception being that the displacement 908 does not vary in the same way. Due to the lash, the rotor 214 is able to move somewhat before being impeded and so the displacement 908 has a rectangular pattern and is much larger than the displacement observed in FIG. 8.

Circumstance 3: Offset Determination with Rotor Impeded in Only One Direction

FIG. 11 illustrates the application of the commutation offset determination approach to a scenario where the rotation of the rotor 214 is impeded in only a single direction.

In a first state 1500, the test value 906 is set to an arbitrary initial value. The sum 902 of the current(s) applied to the winding(s) 216 is progressively ramped up to a predetermined level and the encoder may begin to move. Based on the displacement 908 of the encoder 115, it can be determined whether the rotor 214 is not moving or is moving in the direction in which it is impeded (and so is only moving slightly), or whether the rotor 214 is moving in the direction in which it is not impeded. In this case of FIG. 11, the displacement 908 of the encoder 115 is small and so cannot be observed in FIG. 11, and it is determined that the rotor 214 is moving in the direction in which it is impeded.

In cases where the rotor 214 is impeded in only one direction and during state 1500 the rotor 214 moves in the direction in which it is not impeded, a substantial displacement 908 of the encoder 115 will occur. In such circumstances, as soon as it is determined that the rotor 214 is moving in the direction in which it is not impeded (for example, based on a predetermined threshold), the sum 902 of the current(s) applied to the winding(s) 216 is reduced in order to prevent continued unimpeded rotation of the rotor 214.

For specific values of the test value 906, the current vector would have been parallel to the magnetic flux and no torque would have been exerted upon the rotor 214. In that case, the encoder 115 would not have moved at all.

In state 1510, the same initial test value is used as in state 1500, since it is now known that this test value will cause the rotor 214 to rotate in the direction in which it is impeded. If the test value of state 1500 had yielded a displacement in the direction in which the rotation of the rotor 214 is not impeded, 180 degrees could have been added to the test value of state 1500 to obtain the initial test value of state 1510. The test value 906 is repeatedly increased, and at the end of state 1510, the displacement 908 crosses (from below) the predetermined threshold 1110. By the end of state 1510, the mechanical conditions of the motor have therefore been initialised according to S700.

In state 1515, the test value 906 is repeatedly decreased until, at the end of state 1515, the displacement 908 once again crosses (from below) the predetermined threshold 1110. This state is optional, and ensures consistency with FIGS. 9 and 10, where the offset determination of S500 begins with increasing test values 906. The change from increasing to decreasing test values at the beginning of state 1515 ensures that the rotor does not continue to spin in the direction in which it is not impeded.

In state 1520, the test value 906 is repeatedly increased until, at the end of state 1520, the displacement 908 once more crosses (from below) the predetermined threshold 1110. Accordingly, the threshold crossing at the end of state 1520 corresponds to the end of step S525, and the test value 912 at the end of state 1520 is the first crossing value of step S530.

In state 1530, the test value 906 is repeatedly decreased until, at the end of state 1530, the displacement 908 once more crosses (from below) the predetermined threshold 1110. The threshold crossing at the end of state 1530 corresponds to the end of step S540, and the test value 914 at the end of state 1530 is the second crossing value of step S545.

Once the first crossing value 912 and second crossing value 914 have been determined, the offset 916 is calculated as the mean of the first and second crossing values.

Whilst the above has been described with reference to rotary synchronous motors, the approach described herein could be employed with other types of motors.

Although the above has been described with reference to synchronous motors employing permanent magnets, the permanent magnets described herein could be replaced by electromagnets. Further, although the above has been described with reference to rotary motors, the approaches described herein could also be applied to linear motors (along with associated linear encoders), where the angular offset would instead be a position offset, and the torque would instead be a force.

The approaches described herein may be embodied on a computer-readable medium, which may be a non-transitory computer-readable medium. The computer-readable medium carrying computer-readable instructions arranged for execution upon a processor so as to make the processor carry out any or all of the methods described herein.

The term "computer-readable medium" as used herein refers to any medium that stores data and/or instructions for causing a processor to operate in a specific manner. Such storage medium may comprise non-volatile media and/or volatile media. Non-volatile media may include, for example, optical or magnetic disks. Volatile media may include dynamic memory. Exemplary forms of storage medium include, a floppy disk, a flexible disk, a hard disk, a solid state drive, a magnetic tape, or any other magnetic data storage medium, a CD-ROM, any other optical data storage medium, any physical medium with one or more patterns of holes, a RAM, a PROM, an EPROM, a FLASH-EPROM, NVRAM, and any other memory chip or cartridge.

The present disclosure relates to a method of determining an offset between a detector and a point on a motor, the movement of the point on the motor being impeded in at least one direction. In particular, this disclosure relates to a method of determining a commutation offset for an encoder that works in conjunction with a synchronous motor. The commutation offset is an offset between the detector and the north pole of a magnet of the motor. The method comprises setting a test value for the offset, causing a displacement of the detector based on the test value and measuring that displacement. The method further comprises repeatedly increasing the test value, and causing and measuring a displacement for each so increased test value until it is determined that the test value has crossed a threshold.

As one possibility, for systems having lash between the drive and a gearbox, the magnitude of the currents applied to the stator may be such as to enable movement of the shaft until the gearbox lash is taken up, but not large enough to be able to produce a torque sufficient to turn the gearbox. Such an approach enables offset determination using only a very small current.

Although the above is described with reference to a lift system, the approaches described herein can equally be implemented in other types of system having a motor, from very small systems to large industrial systems.

Although particular types of encoder have been mentioned above, any encoder that can detect and record displacements of a rotor or shaft when impeded can be used.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A method for determining an offset between a detector and a point on a motor, the movement of the point on the motor being impeded in at least one direction, the method comprising performing the steps of:
   a) setting a test value for the offset to a first value;
   b) based on the test value, causing a displacement of the detector and measuring that displacement;
   c) performing one of the steps of:
      i) repeatedly increasing the test value and performing step b) for each so increased test value until it is determined that the displacement of the detector measured for that test value has crossed a threshold from a given direction, wherein the given direction is either from above or below the threshold, and determining a first crossing value indicative of the test value at which it was determined, in step i), that the displacement of the detector had crossed the threshold; and
      ii) repeatedly decreasing the test value and performing step b) for each so decreased test value until it is determined that the displacement of the detector measured for that test value has crossed the threshold from the given direction, and determining a second crossing value indicative of the test value at which it was determined, in step ii), that the displacement of the detector had crossed the threshold;
   d) performing the other of the steps of i) and ii); and
   e) determining the offset based on the first and second crossing values.

2. The method of claim 1, further comprising determining the threshold by, prior to performing step a), performing the steps of:
   1) setting the test value to a second value;
   2) based on the test value, causing a displacement of the detector and measuring that displacement;
   3) repeatedly increasing or decreasing the test value until the test value reaches a first predetermined value and performing step 2) for each so increased or decreased test value; and
   4) determining the threshold based on the measured displacement values.

3. The method of claim 2, wherein step 4) comprises the steps of:
   determining minimum and maximum values of the displacement; and
   calculating the threshold as an average of the minimum and maximum values of the displacement.

4. The method of claim 2, further comprising, prior to performing step a) and subsequent to performing step 4), performing the steps of:
   5) setting the test value to a third value;
   6) based on the test value, causing a displacement of the detector and measuring that displacement; and
   7) repeatedly increasing or decreasing the test value and performing step 6) for each so increased or decreased test value until it is determined that the displacement of the detector measured for that test value has crossed the threshold from the given direction.

5. The method of claim 1, further comprising, prior to performing step a), performing the steps of:
   1) setting the test value to a third value;
   2) based on the test value, causing a displacement of the detector and measuring that displacement; and
   3) repeatedly increasing or decreasing the test value and performing step 2) for each so increased or decreased test value until it is determined that the displacement of the detector measured for that test value has crossed the threshold from the given direction.

6. The method of claim 1, wherein the movement of the point on the motor is impeded in two opposite directions.

7. The method of claim 1, wherein the movement of the point on the motor is impeded in a single direction, further comprising, prior to step a):
   1) setting the test value to a fourth value;
   2) based on the test value, causing a displacement of the detector; and
   3) determining the direction in which the movement of the point on the motor is impeded based upon the displacement caused in step 2),
   wherein the displacement caused in step b) is in the determined direction that the movement of the point on the motor is impeded.

8. The method of claim 7, further comprising, prior to performing step a) and subsequent to performing step 3), performing the steps of:
   4) setting the test value to a third value;
   5) based on the test value, causing a displacement of the detector and measuring that displacement; and
   6) repeatedly increasing or decreasing the test value and performing step 5) for each so increased or decreased test value until it is determined that the displacement of the detector measured for that test value has crossed the threshold from the given direction.

9. The method of claim 1, wherein the motor is a rotary motor.

10. The method of claim 1, wherein the motor is a linear motor.

11. The method of claim 1, further comprising performing, based on the determined offset, a calibration operation on control equipment of the motor.

12. The method of claim 11, further comprising operating the motor following the calibration operation.

13. A drive system comprising a motor and a detector, wherein there is an offset between the detector and a point on the motor, the movement of the point on the motor being impeded in at least one direction; the drive system further comprising a controller arranged to determine the offset by performing the steps of the method of claim 1.

14. A non-transitory computer-readable medium carrying computer-readable instructions arranged, upon execution by a processor, to cause the processor to carry out the method of claim 1.

* * * * *